United States Patent
Gopalakrishnan et al.

(10) Patent No.: US 7,533,358 B2
(45) Date of Patent: May 12, 2009

(54) INTEGRATED SIZING, LAYOUT, AND EXTRACTOR TOOL FOR CIRCUIT DESIGN

(75) Inventors: Prakash Gopalakrishnan, Allison Park, PA (US); Hongzhou Liu, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 36 days.

(21) Appl. No.: 11/580,637

(22) Filed: Oct. 12, 2006

(65) Prior Publication Data

US 2008/0104557 A1    May 1, 2008

(51) Int. Cl.
*G06F 17/50* (2006.01)

(52) U.S. Cl. ............... 716/4; 716/9; 716/10; 716/13; 716/14

(58) Field of Classification Search ........... 716/4, 716/9, 10, 13, 14
See application file for complete search history.

(56) References Cited

U.S. PATENT DOCUMENTS

| | | | | |
|---|---|---|---|---|
| 5,984,510 A * | 11/1999 | Guruswamy et al. | ........... | 716/2 |
| 6,209,123 B1 * | 3/2001 | Maziasz et al. | ........... | 716/14 |
| 6,826,517 B2 * | 11/2004 | Okada | ........... | 703/2 |
| 7,032,194 B1 * | 4/2006 | Hsueh et al. | ........... | 716/4 |
| 7,231,619 B1 * | 6/2007 | Agmon | ........... | 716/5 |
| 7,356,784 B1 * | 4/2008 | Dengi et al. | ........... | 716/2 |
| 2002/0023252 A1 * | 2/2002 | Lee et al. | ........... | 716/6 |
| 2003/0009733 A1 * | 1/2003 | Hathaway et al. | ........... | 716/6 |
| 2008/0022232 A1 * | 1/2008 | McConaghy et al. | ........... | 716/1 |

FOREIGN PATENT DOCUMENTS

JP    2001052041 A    *  2/2001

* cited by examiner

*Primary Examiner*—Phallaka Kik
(74) *Attorney, Agent, or Firm*—Wheelock Chan LLP; Thomas Chan

(57) ABSTRACT

Method and system are disclosed for designing a circuit using an integrated sizing, layout, and extractor tool. In one embodiment, a method for designing a circuit including initializing a set of design points, where a design point comprises a design of the circuit that meets a set of predefined design specifications, determining sizes for the circuit using a size optimization iteration process, and pausing the sizing optimization iteration process periodically for updating parasitic information of the circuit. The method further includes selecting a subset of design points from the set of design points, generating a layout of the circuit using devices sizes obtained from the set of design points, generating an extracted netlist using the layout, wherein the extracted netlist includes parasitic information of the circuit, and simulating the circuit using the extracted netlist to verify the set of predefined design specifications are met.

21 Claims, 4 Drawing Sheets

INTEGRATED SIZING, LAYOUT, AND EXTRACTOR TOOL FOR CIRCUIT DESIGN

FIELD OF THE INVENTION

The present invention relates to the field of electronic design automation tools. In particular, the present invention relates to an integrated sizing, layout, and extractor tool for circuit design.

BACKGROUND OF THE INVENTION

In a conventional analog and mixed-signal design flow, the front-end design and the back-end design are performed independently in a sequential manner. A front-end circuit designer would hand off a size-optimized design to a back-end circuit designer to create the layout and its corresponding extracted netlist containing parasitic information of the circuit. As a result, the parasitic effects from the layout are not taken into account in the front-end design process. This design approach is particularly challenging for analog and mixed-signal designs because of the shrinking design cycles and aggressive performance specifications. As the analog and mixed-signal designs migrate to sub-micron and nanometer technologies, the layout parasitic information may significantly impact the circuit performances.

This conventional design flow is typically iterated multiple times until a desirable result is converged. In this approach, the designer first creates a sized design using the sizing tool. The computed device sizes determined by the sizing tool are then passed to the layout tool to create a layout. After that, an extractor tool is used to create an extracted netlist from the layout. The extracted netlist is then used by the sizing tool again to resize the design. In the conventional design flow, the parasitic information from the extracted netlist that is used by the sizing tool is derived from a previous layout of the design. The variations in device sizes often affect the placement and routing of the circuit, which in turn affect the layout parasitic information. In some situations, a designer may have to iterate multiple times before a desirable result can be achieved, resulting in an overall loss of time. In other situations, this deficiency causes designers to size the circuits over-conservatively, thus compromising the performance goals of the circuit.

Therefore, there is a need for an integrated sizing, layout, and extractor tool that can address the drawbacks of the various problems discussed above. The present invention describes a novel design methodology that integrates sizing, layout, and extractor tools to account for detailed layout parasitic information during the circuit sizing optimization process.

SUMMARY

The present invention relates to an integrated sizing, layout, and extractor tool for circuit design. In one embodiment, a method for designing a circuit includes initializing a set of design points, where a design point comprises a design of the circuit that meets a set of predefined design specifications, determining sizes for the circuit using a size optimization iteration process, and pausing the sizing optimization iteration process periodically for updating parasitic information of the circuit. The method further includes selecting a subset of design points from the set of design points, generating a layout of the circuit using device sizes obtained from the set of design points, generating an extracted netlist using the layout, wherein the extracted netlist includes parasitic information of the circuit, and simulating the circuit using the extracted netlist to verify that the set of predefined design specifications are met.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Methods and systems are provided for designing a circuit using an integrated sizing, layout, and extractor tool. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed instruction, logic block, process, etc., is here conceived to be a self-consistent sequence of one or more instructions leading to a desired result. The instructions are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each instruction may be performed by hardware, software, firmware, or combinations thereof.

Figure 1:
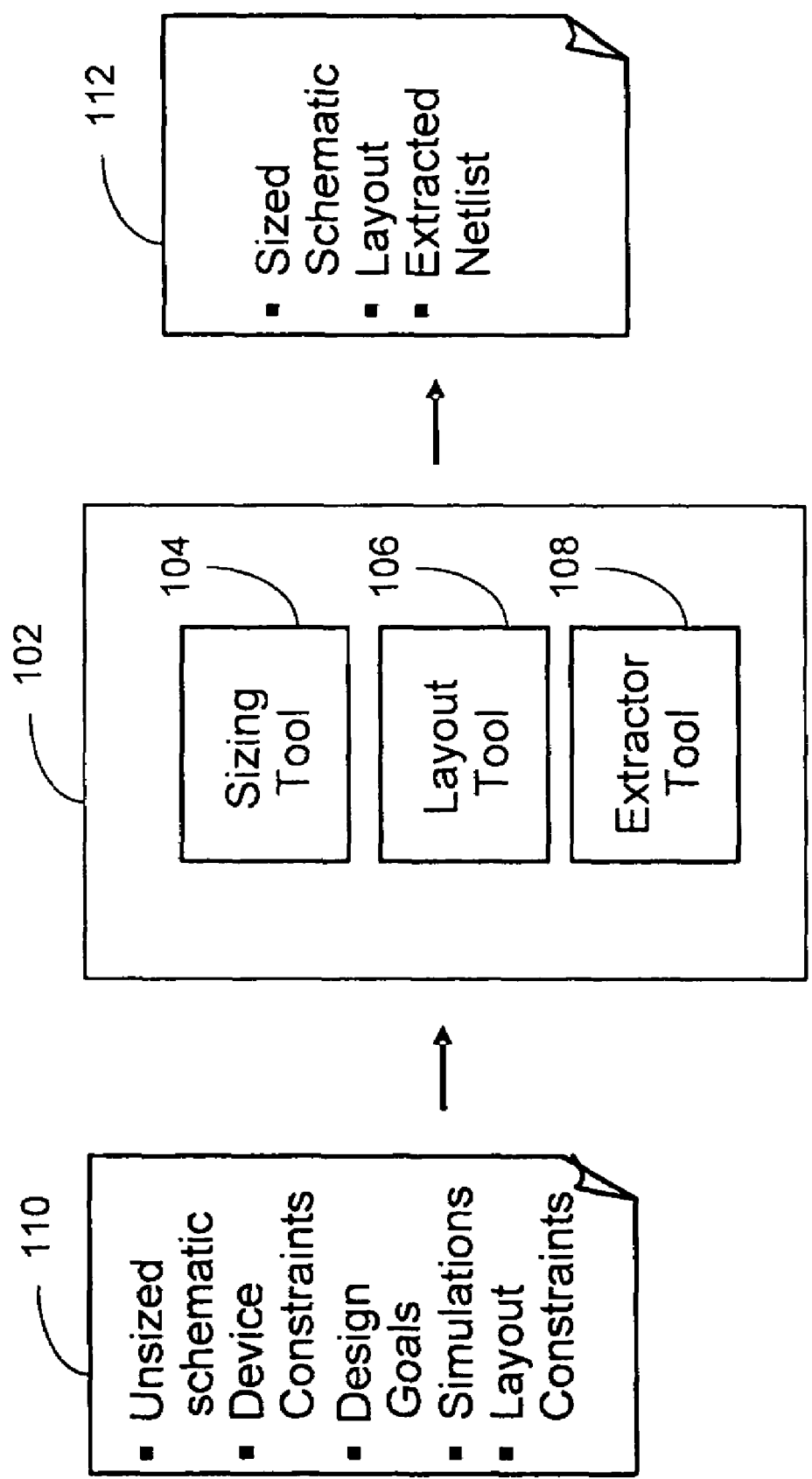
FIG. 1 illustrates a block diagram of an integrated sizing, layout, and extractor tool according to an embodiment of the present invention.

FIG. 1 illustrates a block diagram of an integrated sizing, layout, and extractor tool according to an embodiment of the present invention. As shown in FIG. 1, the integrated sizing, layout, and extractor tool 102 includes a sizing tool 104, a layout tool 106, and an extractor tool 108. Generally, the integrated sizing, layout, and extractor tool is used to automatically size a circuit to meet performance specifications while taking parasitic information of the design into consideration. The sizing tool 104 is used to automatically generate sizes for various devices on the schematic that meet the performance goals in consideration of device constraints. Maximizing gain of a transistor is an example of a performance goal. During a sizing optimization, the sizing tool 104 explores various sizes for the devices, while continuously evaluating each set of device sizes, also known as design points. These design points are evaluated using an extracted netlist generated by the extractor tool, thereby taking parasitic information of the design into account. The layout tool 106 is used to generate a placed-and-routed layout, given a schematic, a set of device sizes and layout constraints. The extractor tool 108 extracts parasitic information of the design from the layout. For example, the parasitic information may include parasitic resistances and capacitances introduced by metal routings that connect the various devices in the layout. The parasitic information may also include information from device geometry, which may not be accurately estimated before the final layout implementation. Details of the layout, extractor, and sizing tool are described below in association with FIGS. 2, 3, and 4 respectively.

The input 110 to the integrated sizing, layout, and extractor tool includes an unsized schematic, a set of device constraints, a set of layout constraints, simulation information, and design goals. An example of a device constraint includes ranges of widths and lengths of a transistor, and an example of a layout constraint includes device symmetry requirements. The output 112 of the integrated sizing, layout, and extractor tool is a sized schematic, a placed-and-routed layout, and an extracted netlist that corresponds to the layout.

In one embodiment, the integrated sizing, layout, and extractor tool may be implemented using a computer system. The computer system may include one or more central processing units (CPUs), at least a user interface for displaying computation results and waveforms, a memory device, a system bus, and one or more bus interfaces for connecting the CPU, user interface, memory device, and system bus together. The computer system also includes at least one network interface for communicating with other devices on a computer network. In alternative embodiments, much of the functionality of the integrated sizing and layout program may be implemented in one or more application-specific integrated circuits (ASICs) or field-programmable gate arrays (FPGAs), thereby either eliminating the need for a CPU, or reducing the role of the CPU.

The memory device may include high-speed random-access memory and may also include non-volatile memory, such as one or more magnetic disk storage devices. The memory device may also include mass storage that is remotely located from the CPU(s). The memory device preferably stores:

- an operating system that includes procedures for handling various basic system services and for performing hardware-dependent tasks;
- databases for storing information of the circuit;
- application programs for performing other user-defined applications and tasks; and
- an integrated sizing, layout, and extractor program for designing the circuit.

The database, the application programs, and the integrated sizing, layout, and extractor program may include executable procedures, sub-modules, tables, and other data structures. In other embodiments, additional or different modules and data structures may be used, and some of the modules and/or data structures listed above may not be used.

Figure 2:
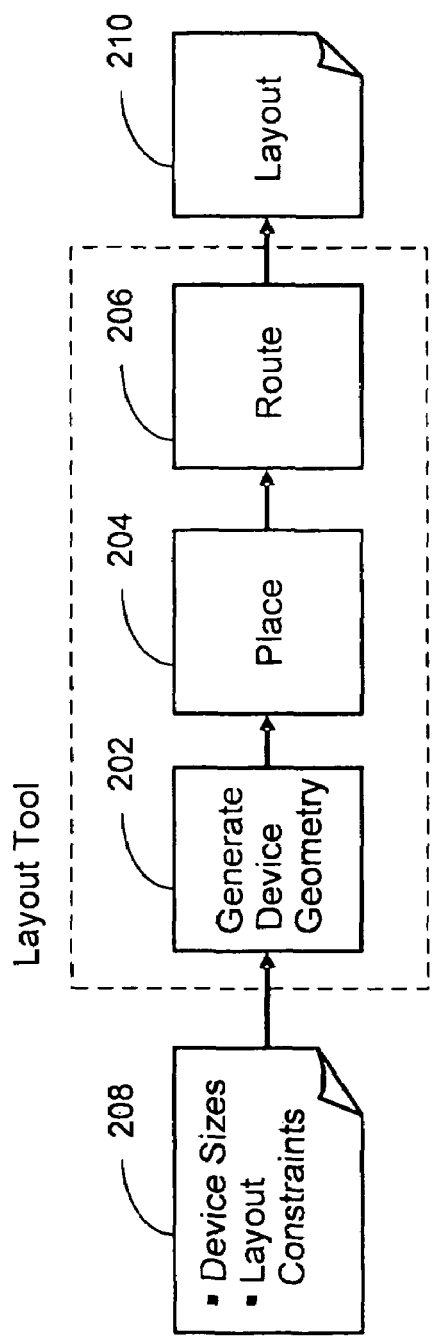
FIG. 2 illustrates an exemplary application of a layout tool according to an embodiment of the present invention.

FIG. 2 illustrates an exemplary application of a layout tool according to an embodiment of the present invention. In this example, the layout design flow involves generating device geometry for the various devices in the circuit schematic (block 202), placing them in the layout (block 204), and routing the various connections between devices (block 206).

The input to the layout tool includes device sizes and layout constraints 208. The output of the layout tool includes a layout 210.

In block 202, the geometry for the devices is generated based on the device sizes and any other user-specified constraints. Examples of device sizes include widths and lengths of a transistor. Next, in block 204, the devices are placed by the layout tool using the device geometry generated. The layout tool may also use additional input from the user to include layout constraints such as symmetry, matching, and grouping constraints of the devices. In block 206, the layout tool routes the interconnections of the devices to generate a layout.

The Virtuoso® NeoCell (http://www.cadence.com/products/custom_ic/neocell) from Cadence Design Systems, Inc. of San Jose, Calif. is an example of a layout tool. It automatically places and routes a circuit such that the devices of the circuit in the layout meet the constraints specified on the design. Another example of a layout tool is described in U.S. patent application Ser. No. 11/231,055, "Optimizing Circuit Layouts," assigned to Cadence Design Systems, Inc., which is incorporated herein in its entirety by reference.

Figure 3:
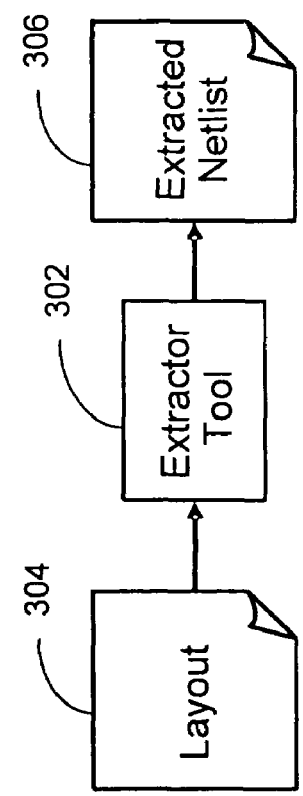
FIG. 3 illustrates an exemplary application of an extractor tool according to an embodiment of the present invention.

FIG. 3 illustrates an exemplary application of an extractor tool according to an embodiment of the present invention. In this example, the extractor tool 302 takes a layout 304 as an input, and it generates an extracted netlist 306 as an output. After the layout is created, the extractor tool is used to determine the parasitic information of the circuit. The parasitic information typically includes parasitic resistances, capacitances, and inductances that are generated from the layout of the circuit schematic. This parasitic information includes undesirable and unavoidable side effects of the device geometry, placement, and routing of the layout. The extractor tool 302 identifies the parasitic information and converts to an extracted netlist 306. The extracted netlist includes the original schematic netlist, additional parasitic circuit elements, and the correspondence between them. Note that the Assura RCX (http://www.cadence.com/products/dfm/assura_rcx) from Cadence Design Systems, Inc. of San Jose, Calif. is an example of a commercially available extractor tool.

Figure 4:
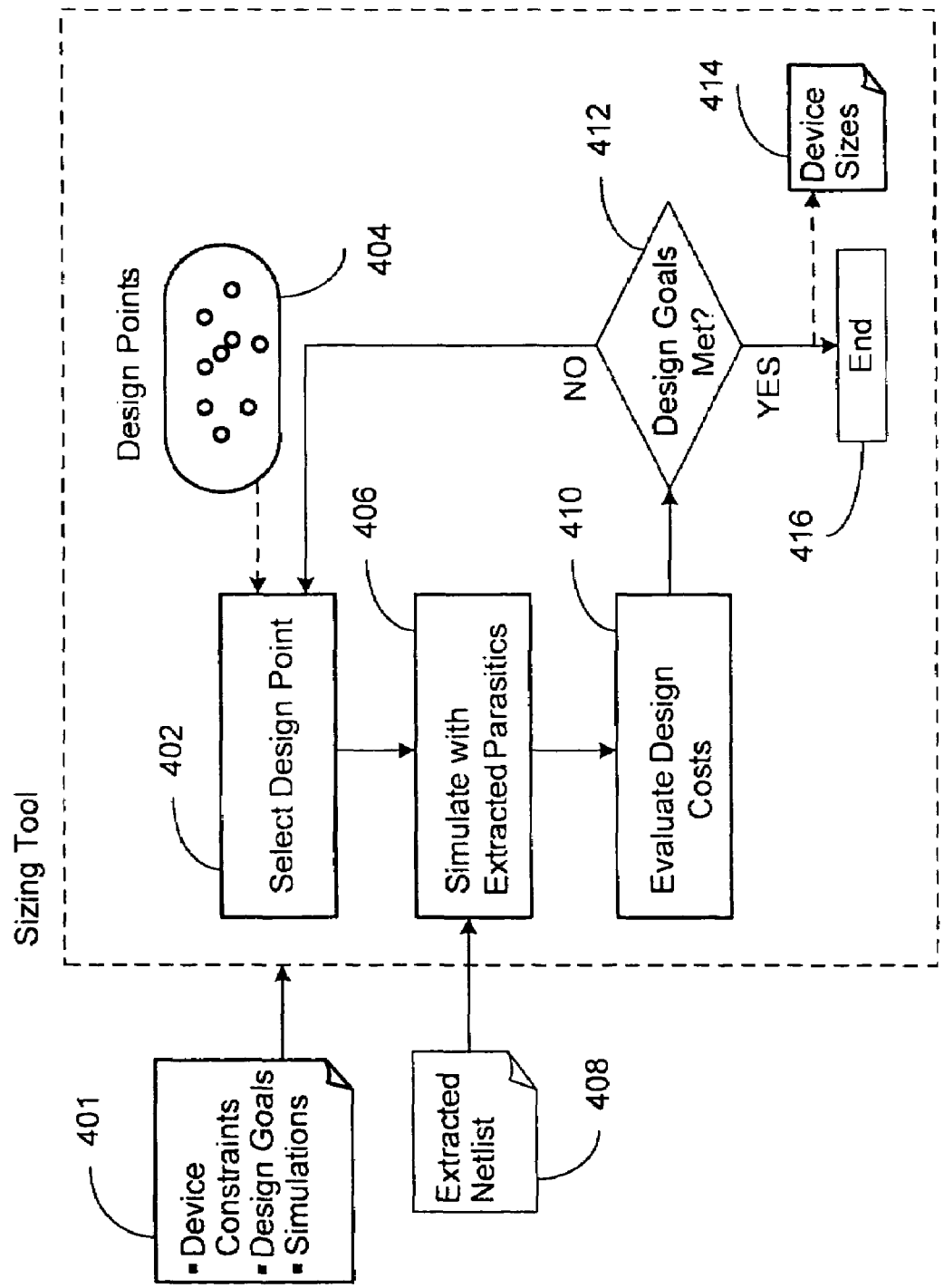
FIG. 4 illustrates an exemplary application of a sizing tool according to an embodiment of the present invention.

FIG. 4 illustrates an exemplary application of a sizing tool according to an embodiment of the present invention. In this example, the sizing tool is used to determine device sizes of an integrated circuit. The input 401 to the sizing tool includes device constraints, simulation information, and design goals. The sizing tool explores a variety of device sizes. A set of sizes for each of the corresponding devices is referred to as a design point. As the sizing tool explores various design points, it evaluates each design point using a user-specified set of simulations to determine whether the design goals are met. Note that in this specification, the sizing tool is also referred to as size iterations, sizing optimizations, or the size optimization iteration process.

Specifically, the sizing tool starts in block 402, where the sizing tool selects a design point for evaluation from a set of predetermined design points 404. In block 406, the sizing tool simulates the selected design point. In order to account for parasitic information of the circuit, the sizing tool uses an extracted netlist 408 instead of the original schematic netlist for simulation. As discussed above, the extracted netlist 408 includes parasitic information from the layout, identified and extracted by the extractor tool. The device sizes are superimposed onto the extracted netlist to reflect the new set of device sizes that the sizing tool may explore. In block 410, the sizing tool evaluates design costs of the circuit. In block 412, a determination is made as to whether the design goals of the circuit are met. If the design goals are not met (412_No), the sizing tool moves to block 402 and repeats blocks 402 to 410 in order to find a design point that satisfies the design goals. In the alternative, if the design goals are met (412_Yes), the sizing tool generates a device sizes file 414 and ends the device-sizing exploration.

An example of a sizing tool is described by R. Phelps, etc. in "ANACONDA: Simulation-based Synthesis of Analog Circuits via Stochastic Pattern Search," IEEE Trans. Computer-Aided Design, CAD-19(6), pp. 703-717, June 2000, which is incorporated herein in its entirety by reference. Another example of a sizing tool is the Virtuoso® NeoCircuit (http://www.cadence.com/products/custom_ic/neocircuit) from Cadence Design Systems, Inc. of San Jose, Calif., which allows designers to capture constraints between various device parameters and specify performance goals for the overall design based on simulation outputs using user-specified test-benches.

Figure 5:
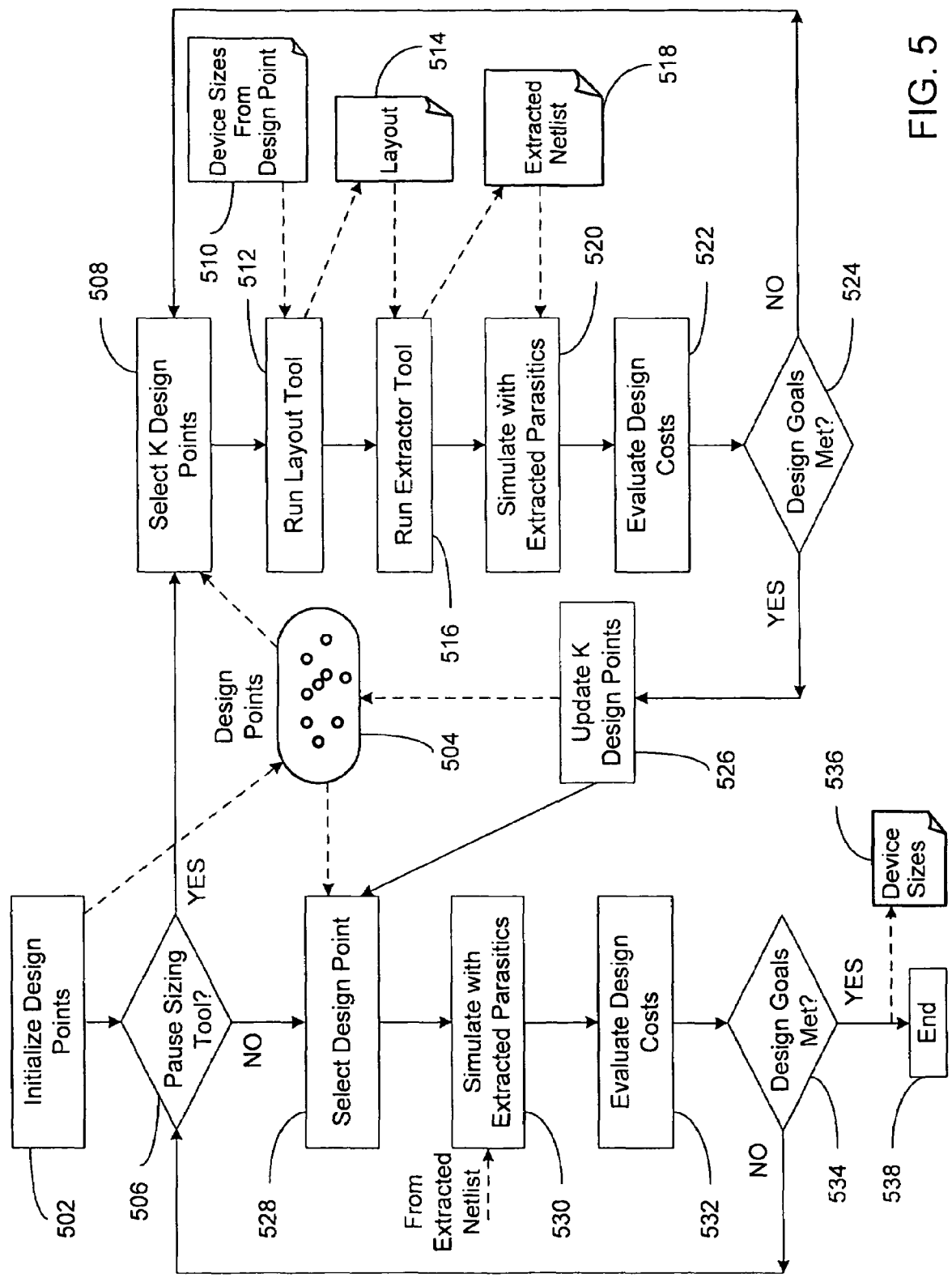
FIG. 5 illustrates a method of circuit design using an integrated sizing, layout, and extractor tool according to an embodiment of the present invention.

FIG. 5 illustrates a method of circuit design using an integrated sizing, layout, and extractor tool according to an embodiment of the present invention. Generally, the present invention tackles the problems of the convention design methodology by employing an integrated sizing, layout, and extractor tool. In this approach, the layout and the extracted netlist of the circuit may be updated during the sizing iterations, making the device sizes used by the layout and extractor tools correspond to the device sizes that are currently being explored by the sizing tool. Thus, this approach improves the accuracy of the parasitic information during the sizing optimization, and reduces the number of iterations required for achieving the design goals. Note that in the description of FIG. 5, a solid arrow is used to show the transition from one block to the next block of the method, while a dotted arrow is used to show the accesses (reads or writes) of files/databases (represented by blocks 504, 510, 514, 518, and 536) used to support the method.

As shown in FIG. 5, the integrated sizing, layout, and extractor tool starts in block 502, where the method initializes a set of design points 504. Initially, the devices in the circuit schematic may not have any sizes. These sizes are not determined until the end of the sizing optimization, which is further discussed below. When a designer starts with an unsized schematic, he may arbitrarily assign certain sizes to the devices. For example, one may set each device parameter to the median value in the user-specified range for the device parameter. Such an arbitrary choice is acceptable because the layout is updated dynamically during the sizing process, which is described in detail below. Note that the initial layout may be created either manually or by using automatic place-and-route methods.

In block 506, the method makes a first determination as to whether the sizing tool needs to be paused to update the layout and the corresponding extracted netlist of the design for the sizing tool. If a decision is made not to pause the sizing tool (506_No), the tool moves to block 528. In the alternative, if a decision is made to pause the sizing tool (506_Yes), the method continues in block 508.

Note that the sizing optimization process may be paused periodically, after a certain number of sizing iterations, involving blocks 528 to 532. It may be advantageous to update the layout and the extracted netlist after a certain number of design point evaluations. This is because it is time-consuming to update the layout and the extracted netlist for every design point evaluation. Also, as the sizing optimization evaluates several design points, it may find that not all design points are different from each other in terms of device sizes. The number of sizing iterations after which to pause the tool is determined by a technique that detects how much the device sizes of the best design point found so far have changed from the last time when the sizing optimization was paused. This is explained in detail below.

In block 508, the method selects a subset of design points (K) for generating a layout and a corresponding extracted netlist. The subset of K design points is a group of best design points (determined so far prior to the pausing of the size optimization iteration process) selected from the set of design points 504, and a file 510 containing device sizes of the K design points is derived from the set of design points 504.

In one implementation, the number of sizing iterations after which to pause the sizing tool is determined by a technique that identifies deviations in sizes of the devices of the best design point found so far from the best design point at the last time when the sizing optimization was paused, for example Point A. For this, the best design point found so far is identified, for example Point B. This means that Point B is also better than Point A. The sizes of devices of Point B are compared with the sizes of the devices of Point A. For each device, the change in device sizes is quantified by measuring the percentage by which the area of the device has changed from Point A to Point B. If this increase in device area is greater than a predetermined threshold value, a designer may decide that it is time to pause the sizing again and update the layout and extracted netlist.

The threshold value is determined empirically in the following manner. The sizing tool is run three times with three different threshold values, such as 5%, 50%, and 80%. The average result and run-time are computed across multiple sample designs. For example, if the average result is better at 5% and 50%, compared with 80%, a new set of three values is chosen for the threshold value using 5%, 50%, and their average value, in this case 27%. This process is repeated until there is no difference between the average results across the boundary values (minimum and maximum) of the range. The predetermined threshold value is the maximum value in the range, since the higher the predetermined threshold value, the fewer number of times the sizing tool is paused to update the layout, which results in reduction in run-time of the sizing tool.

In one approach, the optimal value of K is determined empirically in the following manner. The sizing tool is run three times with three different values of K, for example 2, 10, and 100. The average result and run-time across multiple designs are evaluated. If the average result is better at K=2 and K=10, compared to K=100, a new set of three values are chosen for K by using 2, 10, and their average value, which is 6 in this case. This process is repeated until there is no difference between the average results across the boundary values (minimum and maximum) of the range. The value of K is then the minimum value in the range, since the smaller the value of K, the fewer design points have to be re-evaluated, which results in a reduction in the run-time of the sizing tool.

In block 512, the method runs the layout tool to generate/update a layout 514 using a design point from the K design points selected. During the layout process, the device sizes 510 from the design points are used to update the device sizes in the layout. The placement and routing of the devices in the layout may be performed in a variety of ways. For example, the layout tool may place and route the design to create a layout. The layout tool may also be provided with the previous layout as a reference to create a new layout similar to the previous layout. One may also use layout compaction techniques to achieve the layout of the design. The layout tool creates a new layout 514.

In block 516, the method runs an extractor tool to create an extracted netlist 518 from the layout 514. The extracted netlist 518 contains the parasitic information from the updated layout, which reflects the best sizes from the sizing optimization so far.

In blocks 520 and 522, the method evaluates the K design points found so far using the extracted netlist 518. Specifically, in block 520, the method simulates the design with the extracted netlist 518. In block 522, the method evaluates costs of the design. One method for evaluating the cost of the design point and determining whether design goals of the circuit are met is described in U.S. patent application Ser. No. 11/361,928, "Method and System for Improving Yield of an Integrated Circuit," assigned to Cadence Design Systems, Inc., which is incorporated herein in its entirety by reference.

In block 524, a second determination is made as to whether the design goals are met for the interim sizing optimization of the K design points. If the design goals are not met (524_No), the method moves to block 508 and repeats the blocks 508 to 522 until the design goals are met.

In the alternative, if the design goals are met (524_Yes), the method moves to block 526 where the method updates the set of design points 504 with the K design points. In other words, the method replaces the set of design points 504 and uses the K design points as the process continues with the rest of the sizing optimization. Note that the other design points in the set of design points 504 may be discarded since they no longer correspond to the extracted netlist. The method continues from block 526 to block 528.

In block 528, the method selects a new design point from the set of design points 504 for sizing optimization. In block 530, the method simulates the design with extracted parasitic information using the extracted netlist. Note there are a number of ways of generating the extracted netlist. In one approach, the extracted netlist is the same extracted netlist 518 generated in block 516. In other approaches, the extracted netlist may be pre-generated and imported from other extractor tools. In block 532, the method evaluates costs of the design. In block 534, a third determination is made as to whether the design goals are met for the sizing optimization. If the design goals are not met (534_No), the method moves to block 506 and repeats certain selected blocks from 506 to 532 until the design goals are met. In the alternative, if the design goals are met (534_Yes), the method creates a file 536 containing device sizes that meet the design goals and moves to block 538 where the sizing optimization ends.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method for designing a circuit, wherein the circuit comprises a group of devices, comprising:
    initializing a set of design points, wherein a design point comprises a design of the circuit that meets a set of predefined design specifications;
    determining sizes for the group of devices using a size optimization iteration process;
    pausing the sizing optimization iteration process periodically for updating parasitic information of the circuit;
    selecting a subset of design points from the set of design points;
    generating a layout of the circuit using device sizes obtained from the set of design points;
    generating an extracted netlist using the layout, wherein the extracted netlist includes parasitic information of the circuit;
    simulating the circuit using the extracted netlist to verify the set of predefined design specifications are met.

2. The method of claim 1, wherein pausing the sizing optimization iteration process periodically comprises:
    determining deviations in sizes of the group of devices during a period when the size optimization iteration process is previously paused;
    comparing the deviations in sizes of the group of devices to a set of corresponding predetermined threshold values; and
    pausing the size optimization iteration process in response to the deviations in sizes of the group of devices being larger than the set of corresponding predetermined threshold values.

3. The method of claim 1, wherein selecting a subset of design points comprises:
    selecting a group of best design points that have been identified by the size optimization iteration process.

4. The method of claim 1, wherein generating a layout comprises:
    generating device geometries in accordance with the group of devices and user specified constraints;
    placing the group of devices in the layout using the device geometries; and
    routing the interconnections between the group of devices in the layout.

5. The method of claim 1, wherein generating an extracted netlist comprises:
    generating parasitic information of the layout, wherein the parasitic information includes parasitic resistances, capacitances, and inductances of the circuit; and generating correspondence between the parasitic information and an original schematic netlist of the circuit.

6. The method of claim 5 further comprising:
evaluating whether design goals of the circuit are met; and
generating an updated set of design points with the subset of design points in response to the design goals of the circuit being met.

7. The method of claim 1 further comprising:
selecting a new design point from the updated set of design points for evaluation by the size optimization iteration process;
simulating the circuit using the extracted netlist to verify the set of predefined design specifications are met;
evaluating whether design goals of the circuit being met;
generating a file comprising device sizes for the new design point in response to design goals of the circuit being met; and
repeating the size optimization iteration process with another design point in response to design goals of the circuit not being met.

8. A computer program product for designing a circuit comprising a group of devices, the computer program product comprising a medium storing computer programs code for execution by one or more computer systems, the computer program product further comprising:
code for initializing a set of design points, wherein a design point comprises a design of the circuit that meets a set of predefined design specifications;
code for determining sizes for the group of devices using a size optimization iteration process;
code for pausing the sizing optimization iteration process periodically for updating parasitic information of the circuit;
code for selecting a subset of design points from the set of design points;
code for generating a layout of the circuit using device sizes obtained from the set of design points;
code for generating an extracted netlist using the layout, wherein the extracted netlist includes parasitic information of the circuit;
code for simulating the circuit using the extracted netlist to verify the set of predefined design specifications are met.

9. The computer program product of claim 8, wherein the code for pausing the sizing optimization iteration process periodically comprises:
code for determining deviations in sizes of the group of devices during a period when the size optimization iteration process is previously paused;
code for comparing the deviations in sizes of the group of devices to a set of corresponding predetermined threshold values; and
code for pausing the size optimization iteration process in response to the deviations in sizes of the group of devices being larger than the set of corresponding predetermined threshold values.

10. The computer program product of claim 8, wherein the code for selecting a subset of design points comprises:
code for selecting a group of best design points that have been identified by the size optimization iteration process.

11. The computer program product of claim 8, wherein the code for generating a layout comprises:
code for generating device geometries in accordance with the group of devices and user specified constraints;
code for placing the group of devices in the layout using the device geometries; and
code for routing the interconnections between the group of devices in the layout.

12. The computer program product of claim 8, wherein the code for generating an extracted netlist comprises:
code for generating parasitic information of the layout, wherein the parasitic information includes parasitic resistances, capacitances, and inductances of the circuit; and
code for generating correspondence between the parasitic information and an original schematic netlist of the circuit.

13. The computer program product of claim 12 further comprising:
code for evaluating whether design goals of the circuit are met; and
code for generating an updated set of design points with the subset of design points in response to the design goals of the circuit being met.

14. The computer program product of claim 8 further comprising:
code for selecting a new design point from the updated set of design points for evaluation by the size optimization iteration process;
code for simulating the circuit using the extracted netlist to verify the set of predefined design specifications are met;
code for evaluating whether design goals of the circuit are met;
code for generating a file comprising device sizes for the new design point in response to design goals of the circuit being met; and
code for repeating the size optimization iteration process with another design point in response to design goals of the circuit not being met.

15. A system for designing a circuit comprising a group of devices, comprising:
at least one processing unit for executing computer programs;
a graphical-user-interface for viewing representations of the circuit on a display;
a memory for storing information of the circuit;
logic for initializing a set of design points, wherein a design point comprises a design of the circuit that meets a set of predefined design specifications;
logic for determining sizes for the group of devices using a size optimization iteration process;
logic for pausing the sizing optimization iteration process periodically for updating parasitic information of the circuit;
logic for selecting a subset of design points from the set of design points;
logic for generating a layout of the circuit using device sizes obtained from the set of design points;
logic for generating an extracted netlist using the layout, wherein the extracted netlist includes parasitic information of the circuit;
logic for simulating the circuit using the extracted netlist to verify the set of predefined design specifications are met.

16. The system of claim 15, wherein the logic for pausing the sizing optimization iteration process periodically comprises:
logic for determining deviations in sizes of the group of devices during a period when the size optimization iteration process is previously paused;
logic for comparing the deviations in sizes of the group of devices to a set of corresponding predetermined threshold values; and logic for pausing the size optimization iteration process in response to the deviations in sizes of the group of devices being larger than the set of corresponding predetermined threshold values.

17. The system of claim 15, wherein the logic for selecting a subset of design points comprises:

logic for selecting a group of best design points that have been identified by the size optimization iteration process.

18. The system of claim 15, wherein the logic for generating a layout comprises:

logic for generating device geometries in accordance with the group of devices and user specified constraints;

logic for placing the group of devices in the layout using the device geometries; and logic for routing the interconnections between the group of devices in the layout.

19. The system of claim 15, wherein the logic for generating an extracted netlist comprises:

logic for generating parasitic information of the layout, wherein the parasitic information includes parasitic resistances, capacitances, and inductances of the circuit; and logic for generating correspondence between the parasitic information and an original schematic netlist of the circuit.

20. The system of claim 19 further comprising:

logic for evaluating whether design goals of the circuit are met; and logic for generating an updated set of design points with the subset of design points in response to the design goals of the circuit being met.

21. The system of claim 15 further comprising:

logic for selecting a new design point from the updated set of design points for evaluation by the size optimization iteration process;

logic for simulating the circuit using the extracted netlist to verify the set of predefined design specifications are met;

logic for evaluating whether design goals of the circuit are met;

logic for generating a file comprising device sizes for the new design point in response to design goals of the circuit being met; and logic for repeating the size optimization iteration process with another design point in response to design goals of the circuit not being met.

* * * * *